US012578408B2

(12) United States Patent
Cauley et al.

(10) Patent No.: US 12,578,408 B2
(45) Date of Patent: Mar. 17, 2026

(54) AUTOCALIBRATED MULTI-SHOT MAGNETIC RESONANCE IMAGE RECONSTRUCTION WITH JOINT OPTIMIZATION OF SHOT-DEPENDENT PHASE AND PARALLEL IMAGE RECONSTRUCTION

(71) Applicant: The General Hospital Corporation, Boston, MA (US)

(72) Inventors: Stephen Cauley, Winchester, MA (US); Kawin Setsompop, Charlestown, MA (US); Lawrence Wald, Cambridge, MA (US); Berkin Bilgic, Winchester, MA (US)

(73) Assignee: The General Hospital Corporation, Boston, MA (US)

( * ) Notice: Subject to any disclaimer, the term of this patent is extended or adjusted under 35 U.S.C. 154(b) by 202 days.

(21) Appl. No.: 18/552,970

(22) PCT Filed: Mar. 28, 2022

(86) PCT No.: PCT/US2022/022158
§ 371 (c)(1),
(2) Date: Sep. 28, 2023

(87) PCT Pub. No.: WO2022/212264
PCT Pub. Date: Oct. 6, 2022

(65) Prior Publication Data
US 2024/0183923 A1    Jun. 6, 2024

Related U.S. Application Data

(60) Provisional application No. 63/167,087, filed on Mar. 28, 2021.

(51) Int. Cl.
*G01V 3/00* (2006.01)
*G01R 33/56* (2006.01)
(Continued)

(52) U.S. Cl.
CPC ..... *G01R 33/5616* (2013.01); *G01R 33/5608* (2013.01); *G06T 7/0012* (2013.01);
(Continued)

(58) Field of Classification Search
CPC .............. G01R 33/287; G01R 33/4835; G01R 33/5608; A61B 2090/374
(Continued)

(56) References Cited

U.S. PATENT DOCUMENTS 7,860,291 B2 * 12/2010 Hwang ............ G01R 33/56509
382/128
2013/0181712 A1 * 7/2013 Sutton ................ G01R 33/5676
324/314
(Continued)

FOREIGN PATENT DOCUMENTS

CN    107507148 B    * 12/2018    ............. G06N 3/045
CN    110940943 A    * 3/2020    ........... G06F 18/214
(Continued)

OTHER PUBLICATIONS

PCT International Search Report and Written Opinion, PCT/US2022/022158, Jul. 8, 2022, 7 pages.

*Primary Examiner* — Walter L Lindsay, Jr.
*Assistant Examiner* — Frederick Wenderoth
(74) *Attorney, Agent, or Firm* — QUARLES & BRADY LLP

(57) ABSTRACT

Images are reconstructed from k-space acquired with a magnetic resonance imaging ("MRI") system using a multi-shot pulse sequence. In each iteration, a phase-aware image reconstruction, a data-consistency update across all shots or subsets of data, and a relative phase estimation across the reconstructed images for each shot are performed. In this way, the reconstruction framework recasts the problem as an iterative relative phase estimation problem, which allows for
(Continued)

the use relative phase estimation techniques. Through an iterative search, an artifact-free combined image and the smooth relative phase between each shot in the multi-shot k-space data can be jointly estimated.

12 Claims, 7 Drawing Sheets

(51) Int. Cl.
   *G01R 33/561*      (2006.01)
   *G06T 7/00*      (2017.01)
   *G06T 11/00*      (2006.01)
(52) U.S. Cl.
   CPC .......... *G06T 11/005* (2013.01); *G06T 11/006* (2013.01); *G06T 2207/10088* (2013.01); *G06T 2207/20081* (2013.01); *G06T 2207/30016* (2013.01); *G06T 2210/41* (2013.01); *G06T 2211/424* (2013.01); *G06T 2211/441* (2023.08)

(58) Field of Classification Search
   USPC ........................................................ 324/309
   See application file for complete search history.

(56)          References Cited

U.S. PATENT DOCUMENTS

| 2015/0097565 | A1* | 4/2015 | Basha | ............... | G01R 33/4824 |
| | | | | | 324/318 |
| 2020/0011951 | A1 | 1/2020 | Shi et al. | | |
| 2020/0279413 | A1 | 9/2020 | Wheaton et al. | | |
| 2020/0300956 | A1* | 9/2020 | Hargreaves | ........... | A61B 5/055 |

FOREIGN PATENT DOCUMENTS

| WO | 2020198475 A1 | 10/2020 |
| WO | 2020217098 A2 | 10/2020 |

* cited by examiner

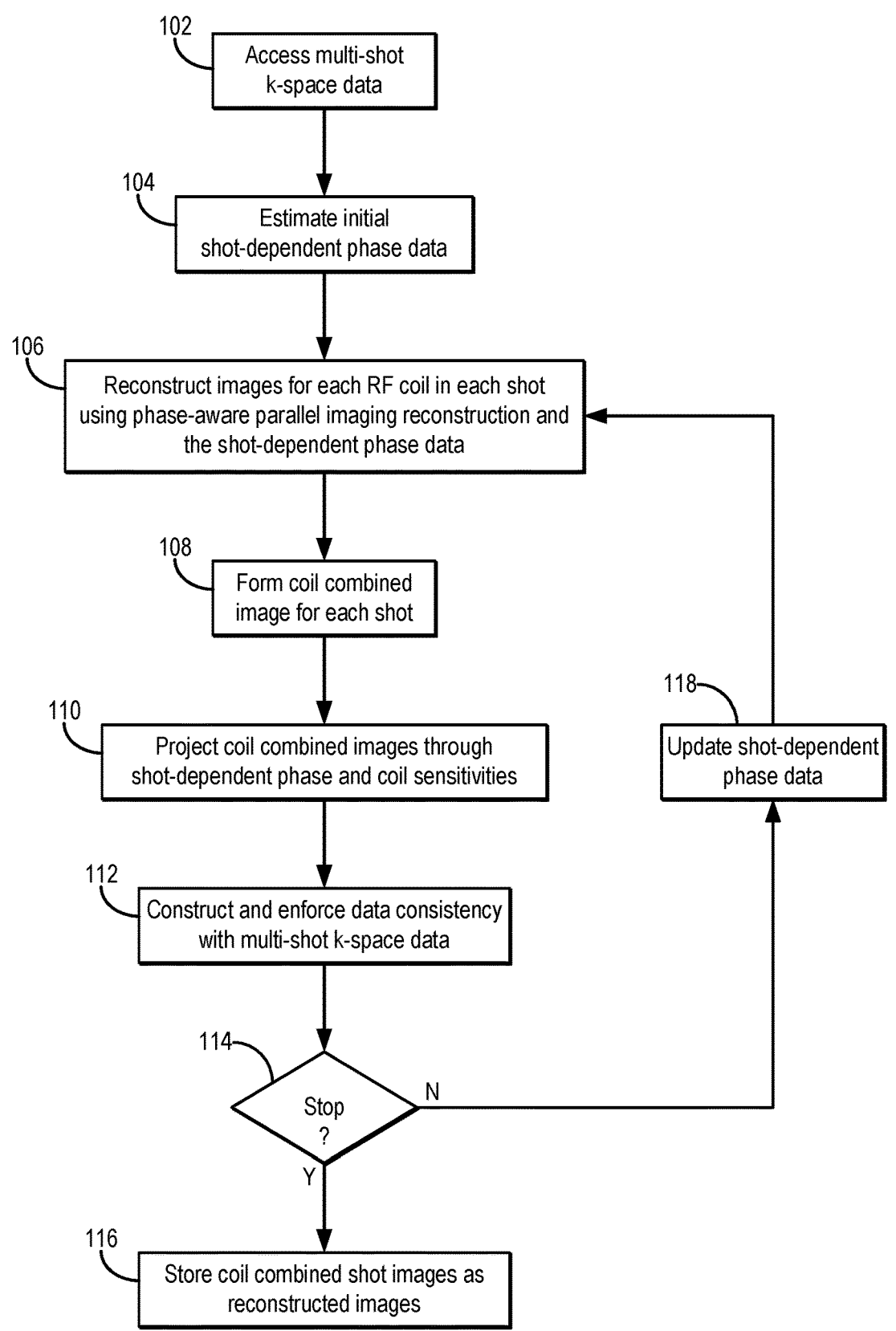

102 Access multi-shot k-space data

104 Estimate initial shot-dependent phase data

106 Reconstruct images for each RF coil in each shot using phase-aware parallel imaging reconstruction and the shot-dependent phase data 108 Form coil combined image for each shot 110 Project coil combined images through shot-dependent phase and coil sensitivities 112 Construct and enforce data consistency with multi-shot k-space data 114 Stop ?

N

118 Update shot-dependent phase data

Y

116 Store coil combined shot images as reconstructed images

FIG. 1

AUTOCALIBRATED MULTI-SHOT MAGNETIC RESONANCE IMAGE RECONSTRUCTION WITH JOINT OPTIMIZATION OF SHOT-DEPENDENT PHASE AND PARALLEL IMAGE RECONSTRUCTION

STATEMENT OF FEDERALLY SPONSORED RESEARCH

This invention was made with government support under EB020613, HD087211, EB015896, and EB006847 awarded by the National Institutes of Health. The government has certain rights in the invention.

BACKGROUND

Single-shot two-dimensional ("2D") echo-planar imaging ("EPI") acquisitions are routinely used for both diffusion-weighted and functional magnetic resonance imaging ("fMRI") studies. Several methods for acceleration have been explored to reduce the long pulse repetition time ("TR") associated with high-resolution full-brain coverage imaging. Accelerated 2D parallel imaging techniques are used to remove phase-encoding steps during an acquisition. These methods have many benefits, such as a reduction of image distortion and T2* blurring. These benefits are furthered through recent advances in model-based reconstruction, where joint reconstruction of multiple highly acceler-ated EPI shots is performed.

In some previous methods, a low-rank representation for the block-Hankel matrix across shots was considered. The foundation of these methods is an assumption that the smooth relative phase differences between the shots would live in the null space of the block-Hankel matrix, which is composed of shifted copies of the k-space data. Although in certain scenarios these methods perform well, the underlying assumption need not be satisfied.

SUMMARY OF THE DISCLOSURE

The present disclosure addresses the aforementioned drawbacks by providing a method for reconstructing an image from data acquired with a magnetic resonance imaging ("MRI") system. Multi-shot k-space data are accessed with a computer system, where the multi-shot k-space data have been acquired with an MRI system using a pulse sequence that includes multiple shots. Shot-dependent phase data are also accessed with the computer system, where the shot-dependent phase data includes estimates of relative phase differences between the multiple shots. An image of the subject is reconstructed from the multi-shot k-space data using the computer system. An image reconstruction algo-rithm that incorporates and iteratively updates the shot-dependent phase data based in part on a self-consistency of the reconstructed image with the multi-shot k-space data is used.

The foregoing and other aspects and advantages of the present disclosure will appear from the following descrip-tion. In the description, reference is made to the accompa-nying drawings that form a part hereof, and in which there is shown by way of illustration one or more embodiments. These embodiments do not necessarily represent the full scope of the invention, however, and reference is therefore made to the claims and herein for interpreting the scope of the invention.

BRIEF DESCRIPTION OF THE DRAWINGS

FIG. 1 is a flowchart setting forth the steps of an example method for jointly reconstructing an image from multi-shot k-space data and estimating relative phase differences between shots of the multi-shot k-space data.

DETAILED DESCRIPTION

Figure 2:
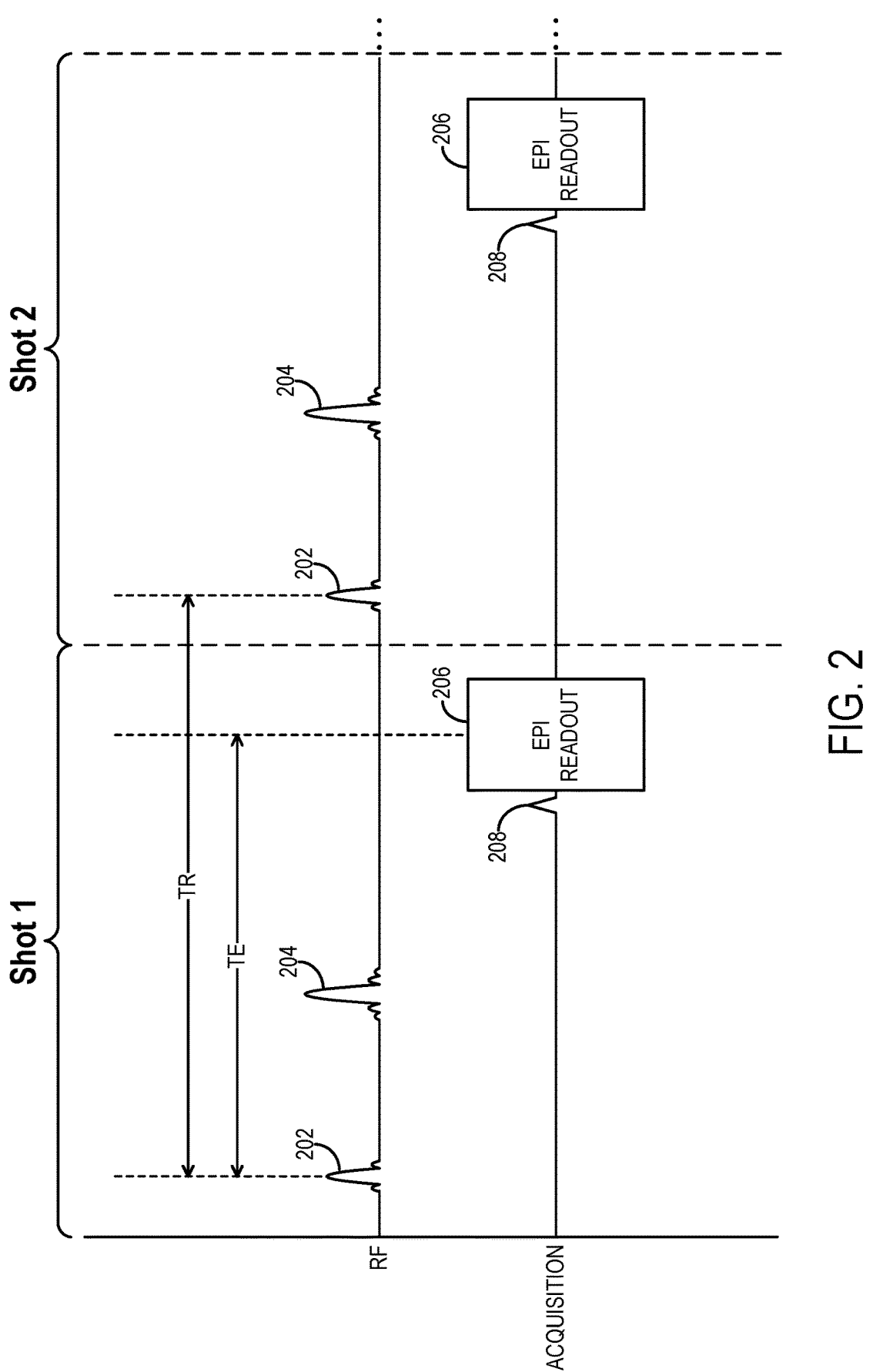
FIG. 2 is an example of a multi-shot echo planar imaging ("msEPI") pulse sequence that can be used to acquire multi-shot k-space data.

Described here are systems and method for reconstructing images from data acquired with a magnetic resonance imag-ing ("MRI") system. In general, the reconstruction tech-niques described in the present disclosure allow for the reconstruction of multi-shot data that were acquired in the presence of phase variations, and which contain under-sampled or highly undersampled k-space data. The recon-struction framework combines a phase-aware image recon-struction, which in some instances may be a phase-aware parallel imaging reconstruction, with a self-consistency-based phase estimation. This corresponds to a data-consis-tency-based joint optimization of the underlying image(s) and phase relationships between each acquisition shot (or subset of k-space data).

The reconstruction framework described in the present disclosure generally includes three components in each iteration: a phase-aware image reconstruction, a data-con-sistency update across all shots or subsets of data, and a relative phase estimation across the reconstructed images for each shot. The systems and method described in the present disclosure provide advantages over current approaches that perform multi-shot reconstruction using strict low-rank con-straints. In particular, the reconstruction framework described in the present application recasts the problem as an iterative relative phase estimation problem. This allows for the use relative phase estimation techniques (e.g., ESPIRiT), which are formulated for determining relative magnitude and phase differences between multi-coil receive arrays. Through an iterative search, an artifact-free combined image and the smooth relative phase between each shot in the multi-shot k-space data can be jointly estimated.

Advantageously, machine learning ("ML") algorithms or models can be incorporated into the reconstruction framework to improve the quality of the reconstructed image(s). For instance, ML priors can be incorporated into the iterative reconstruction in order to improve each phase-aware image reconstruction. Combining ML with the reconstruction framework in this manner leads to improved robustness and speed of convergence for joint optimization. As one non-limiting example, an ML prior can be trained to remove artifacts (e.g., artifacts caused by model error) during each phase-aware image reconstruction step. By mitigating artifacts and removing the structural aliasing pattern, such an ML prior facilitates phase estimating having a desired accuracy.

Referring now to FIG. 1, a flowchart is illustrated as setting forth the steps of an example method for reconstructing one or more images using an image reconstruction framework that implements joint optimization of shot-dependent phase and parallel imaging reconstruction. The iterative reconstruction framework jointly estimates an artifact-free coil combined image and the relative phase between each shot in multi-shot k-space data.

The method includes accessing multi-shot k-space data with a computer system, as indicated at step 102. Accessing the multi-shot k-space data can include retrieving previously acquired data from a memory or other data storage device or medium. Additionally or alternatively, accessing the multi-shot k-space data can include acquiring the data with an MRI system and communicating or otherwise transferring the data to the computer system, which in some embodiments may be a part of the MRI system or a standalone computer system.

In general, the multi-shot k-space data include undersampled k-space data acquired using a multichannel receive coil, such as a radio frequency ("RF") coil array having multiple receive coils or elements. The undersampled k-space data can include k-space data that have been acquired with in-plane acceleration, such as by skipping phase-encoding lines to undersample k-space in the phase-encoding dimension. Additional or alternative in-plane acceleration can also be used.

As a non-limiting example, the k-space data can be acquired using an echo planar imaging ("EPI") pulse sequence. The k-space data also generally include data that have been acquired using a multi-shot pulse sequence, such as a multi-shot EPI ("msEPI") pulse sequence that acquires k-space data in multiple different shots. Multi-shot pulse sequences that use data acquisition strategies other than an EPI readout can also be used.

An example of an msEPI pulse sequence is illustrated in FIG. 2. In this example pulse sequence, k-space data acquired in multiple different shots using a spin-echo EPI acquisition. Each shot includes a radio frequency ("RF") excitation pulse 202 followed by an RF refocusing pulse 204. As a non-limiting example, the RF excitation pulse 202 can be a 90-degree excitation pulse and the RF refocusing pulse 204 can be a 180-degree refocusing pulse. Data are acquired by sampling k-space using an EPI readout 206, which is preceded by a phase-encoding gradient blip 208. Different segments, subsets, regions, or portions of k-space can be sampled in different shots. For example, in a two-shot sequence, one half of k-space can be sampled in the first shot and the other half of k-space can be sampled in the second shot. The msEPI pulse sequence can include more than two shots, and k-space data can be acquired by sampling sequential segments of k-space in different shots, interleaved segments of k-space in different shots, or the like.

The pulse sequence illustrated in FIG. 2 can be modified and adapted as is known in the art for different imaging tasks or applications. For instance, the spin-echo EPI readout could be replaced with a gradient-echo EPI readout. Additionally or alternatively, other gradients and RF pulses can be incorporated to achieve different effects. For example, diffusion-encoding gradients can be used to provide diffusion weighting of the acquired k-space data; fat suppression RF pulses can be incorporated; magnetization preparation pulses and/or gradients can be incorporated; and so on.

Referring again to FIG. 1, initial shot-dependent phase data are estimated at step 104. For instance, the initial shot-dependent phase data can include estimates of the relative phase between shots in the multi-shot k-space data. The initial shot-dependent phase data can include individual phase maps for each shot, which can be estimated using images reconstructed using a parallel imaging reconstruction, such as SENSE reconstruction, across all of the shots in the multi-shot k-space data. In some other embodiments, the initial shot-dependent phase data can include phase maps having phase values initialized to arbitrary values (e.g., zero phase values).

Images are then reconstructed from the multi-shot k-space data using a phase-aware parallel imaging reconstruction technique, as indicated at step 106. As one example, the initial images can be reconstructed using a phase-aware SENSE reconstruction across all of the shots in the multi-shot k-space data in which the shot-specific phases estimated in the initial shot-dependent phase data are included in the reconstruction. In some embodiments, coil sensitivity data are accessed by the computer system when reconstructing the initial images. These coil sensitivity data can be previously acquired coil sensitivity data, or coil sensitivity data that are generated by the computer system from the multi-shot k-space data or other calibration data acquired with the MRI system as part of the initial image reconstruction. Additionally or alternatively, the coil sensitivity data can be estimated, extracted, or otherwise generated from autocalibration data acquired as part of the multi-shot k-space data.

As described above, in some embodiments, one or more ML priors can be incorporated into the phase-aware parallel imaging reconstruction. As one non-limiting example, one or more ML priors can be used, in some implementations, to assist with speed and robustness of convergence. For instance, an ML prior can include a neural network that is trained to remove artifacts (e.g., artifacts caused by model error) during each phase-aware parallel imaging reconstruction. By mitigating artifacts and removing the structural aliasing pattern, the ML prior facilitates phase estimation having a desired accuracy.

The reconstructed images are then combined to form a coil combined image, as indicated at step 108. The coil combined image is then projected through the phase estimates using the shot-dependent phase data and through the coil sensitivities using the coil sensitivity data, generating a phase-updated combined image, as indicated at step 110.

The phase-combined image and the multi-shot k-space data are then utilized to form and enforce a data consistency condition, as indicated at step 112. A stopping criterion is then evaluated to determine whether image reconstruction should be iterated, or whether the current coil combined shot images should be stored as the reconstructed imaged, as indicated at step 114. If the stopping criterion is satisfied, the coil combined shot images are stored as the reconstructed images at step 116. As a non-limiting example, the stopping criterion can be based on whether the enforced data consistency satisfies a threshold requirement.

If the stopping criterion is not satisfied, then updated shot-dependent phase data are then estimated from the coil combined shot images, as indicated at step 118. For instance, the updated shot-dependent phase data can be estimated using a technique such as ESPIRIT to determine the relative phase differences between shots. ESPIRIT, as an example, can be leveraged to arrive at smooth relative phases between the shots. The compact phase model provided by ESPIRIT implements low-rank block-Hankel properties, locally low-rank properties, and spatial continuity of phase. The phase estimation method includes the use of a self-consistency property, that is primarily used to describe the relationship between multi-coil data, to efficiently estimate phase variations that arise during multi-shot acquisitions. For example, an ESPIRIT algorithm can be used to estimate the magnitude and phase relationships between the multiple sources of data available during these acquisitions. By construction, the ESPIRIT algorithm can be used to derive sensitivity maps for multi-coil data based on self-consistency of the parallel imaging properties across the multi-sensor data. This self-consistency across the multiple imaging shots can be used to derive relative phase maps. The accuracy of the phase estimates improves with each step of the iterative procedure described above. The reconstruction process of steps 106-112 is then repeated in a next iteration using the updated shot-dependent phase data in place of the initial shot-dependent phase data.

Figure 3:
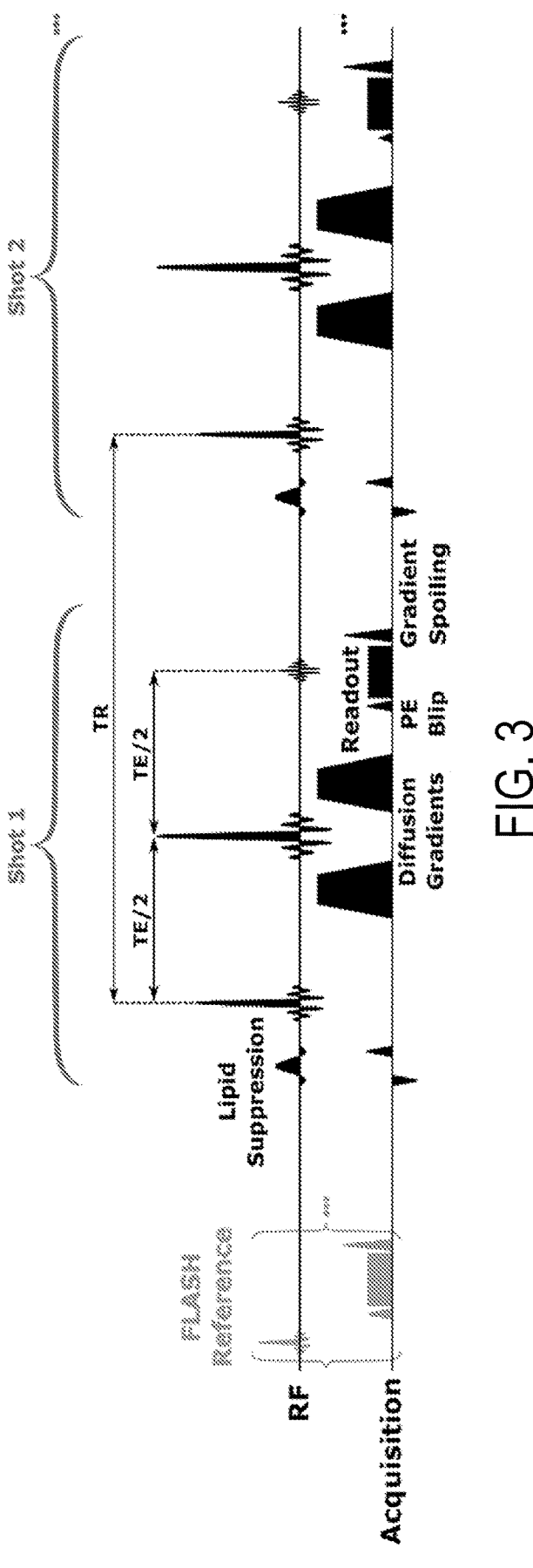
FIG. 3 is an example of a diffusion-weighted msEPI pulse sequence that can be used to acquire multi-shot k-space data.

In an example study, the image reconstruction framework described in the present disclosure was implemented to reconstruct images from multi-shot k-space data acquired from a subject using a diffusion-weighted msEPI pulse sequence. For example, the multi-shot monopolar diffusion pulse sequence shown in FIG. 3 was used. Data for sensitivity map estimation were obtained from a low resolution, 2D FLASH reference scan acquired during the first 2.5 s of the acquisition. Data for each shot were then obtained from successive, highly undersampled EPI readouts, which were shifted in k-space such that the ky-lines from each shot could be interleaved together to provide a single set of k-space data at the desired undersampling rate.

Multi-shot k-space data were acquired at 1.2×1.2×4.0 mm$^3$, R=1, 224×224 mm$^2$ FOV, PF-6/8, 32 slices, b=1000 s/mm$^2$, and BW=1132 Hz/px using a 32-channel coil. In this example study, fully sampled data arising from the use of 3 shots at [TR, TE]=[4800,94] ms, and 8 shots at [TR, TE]=[5400,51] ms were also considered.

Figure 4:
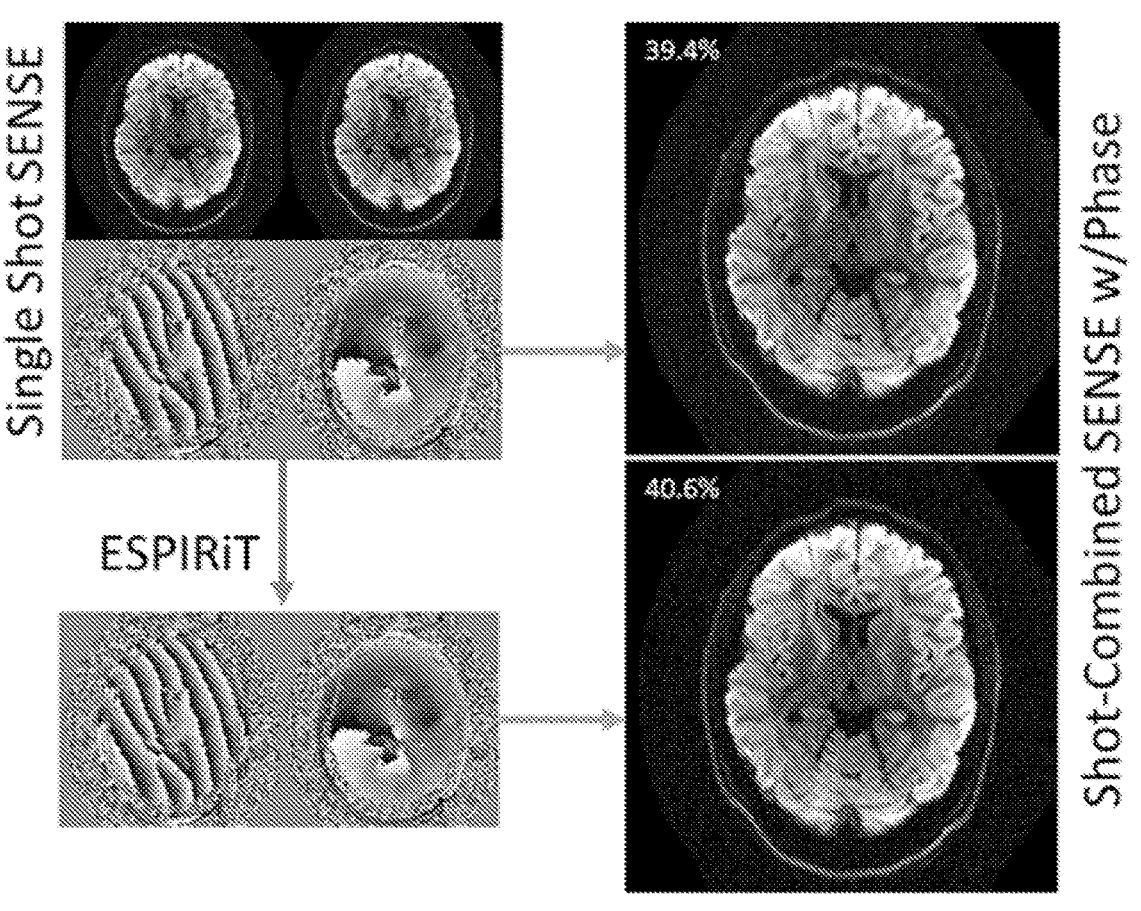
FIG. 4 illustrates a demonstration of accuracy for ESPIRIT phase modeling applied to diffusion imaging at b=1000 s/mm$^2$. Phase estimation was performed across single-shot SENSE reconstructions for 2 of the 3 acquired shots. Shot-combined reconstruction was performed using the ground-truth and ESPIRIT maps. Data consistency error is shown in the top-left of the shot-combined magnitude images.

The accuracy of ESPIRIT for representing relative phase relationships in diffusion data was tested on three-segment data. These R=3, b=1000 s/mm$^2$ data can be reliably reconstructed using SENSE and were used as the ground truth. FIG. 4 shows the magnitude and phase images from two of the single shot reconstructions. These complex data were used as input to ESPIRIT, with 48×48 calibration size and 12×12 kernel size, and the relative phase maps were extracted. The single shot SENSE and ESPIRIT phases were each used within combined-shot R=1.5 SENSE reconstructions, and the data consistency error was 39.4% and 40.6%, respectively.

Figure 5:
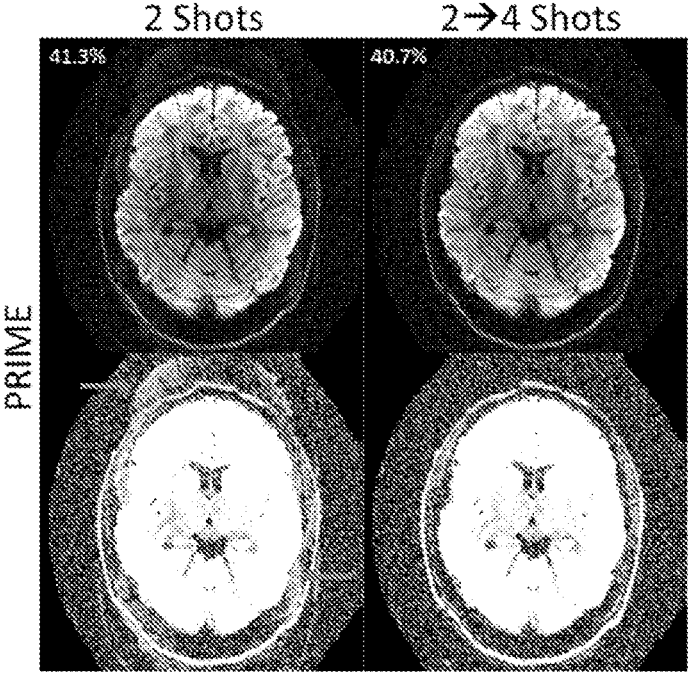
FIG. 5 illustrates a demonstration of EPI ghost correction using the image reconstruction framework described in the present disclosure. The standard phase model for the 2 shot data cannot capture the variation across the even and odd lines of each shot, leading to ghosts. The data is then separated into 4 shots and the reconstruction framework applied to mitigate the ghosts. The data consistency error for each reconstruction is shown at the top left of each image.

FIG. 5 shows the applicability of the reconstruction framework described in the present disclosure for calibration-free removal of even/odd ghosts. Here, the acquired k-space segments were separated into even and odd shots. Reconstruction improvement and data consistency error reduction are shown. In this way, the reconstruction framework can model phase variation across even and odd EPI lines.

An iterative approach for multi-shot reconstruction based on shot-combined SENSE and ESPIRIT phase estimation has been described. In an example study, the reconstruction algorithm converged in a single iteration and the model accurately captured the significant phase variation to arrive within ~1% data consistency compared to a ground-truth.

Figure 6:
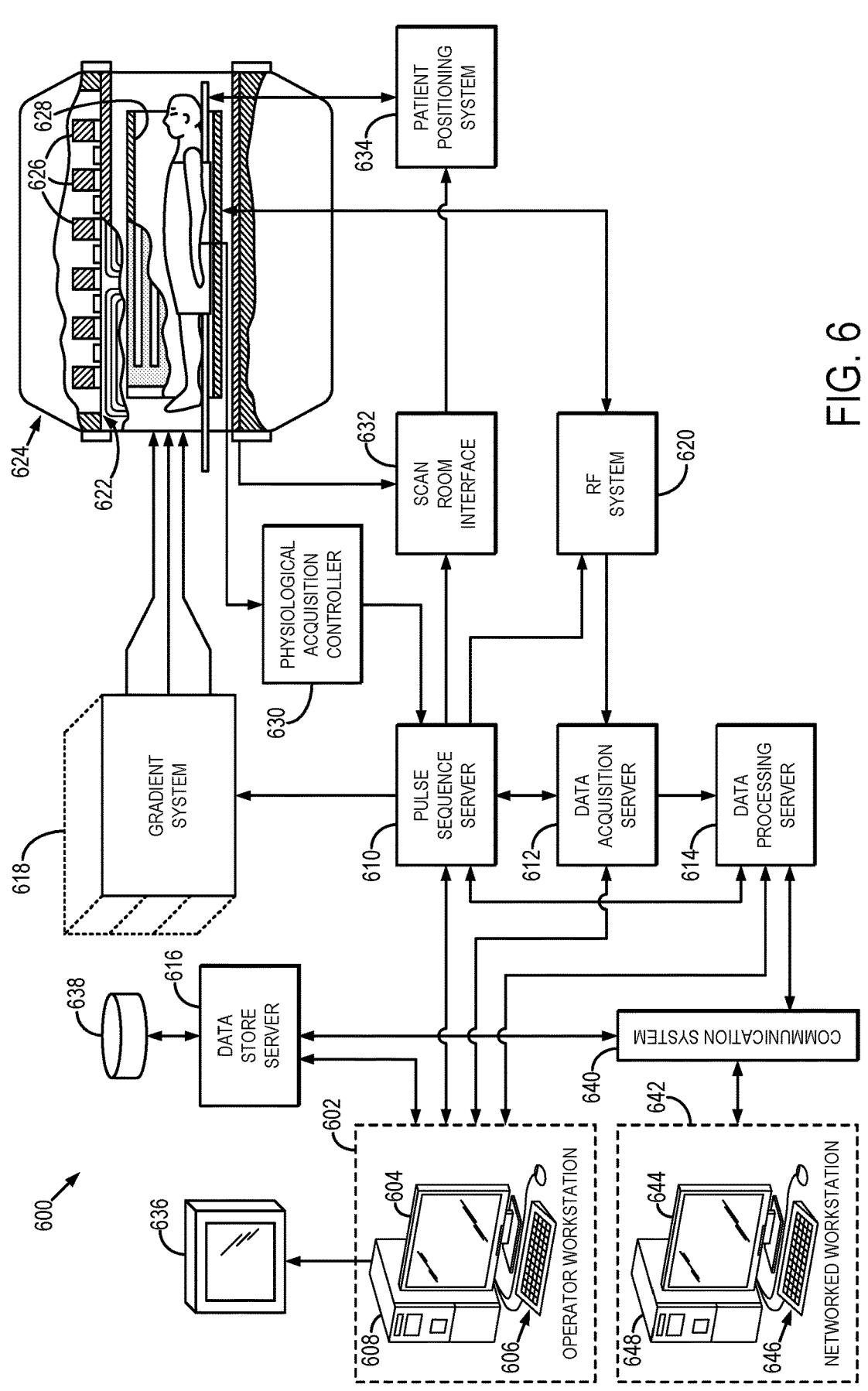
FIG. 6 is a block diagram of an example magnetic resonance imaging ("MRI") system that can implement the methods described in the present disclosure.

Referring particularly now to FIG. 6, an example of an MRI system 600 that can implement the methods described here is illustrated. The MRI system 600 includes an operator workstation 602 that may include a display 604, one or more input devices 606 (e.g., a keyboard, a mouse), and a processor 608. The processor 608 may include a commercially available programmable machine running a commercially available operating system. The operator workstation 602 provides an operator interface that facilitates entering scan parameters into the MRI system 600. The operator workstation 602 may be coupled to different servers, including, for example, a pulse sequence server 610, a data acquisition server 612, a data processing server 614, and a data store server 616. The operator workstation 602 and the servers 610, 612, 614, and 616 may be connected via a communication system 640, which may include wired or wireless network connections.

The pulse sequence server 610 functions in response to instructions provided by the operator workstation 602 to operate a gradient system 618 and a radiofrequency ("RF") system 620. Gradient waveforms for performing a prescribed scan are produced and applied to the gradient system 618, which then excites gradient coils in an assembly 622 to produce the magnetic field gradients G$_x$, G$_y$, and G$_z$ that are used for spatially encoding magnetic resonance signals. The gradient coil assembly 622 forms part of a magnet assembly 624 that includes a polarizing magnet 626 and a whole-body RF coil 628.

RF waveforms are applied by the RF system 620 to the RF coil 628, or a separate local coil to perform the prescribed magnetic resonance pulse sequence. Responsive magnetic resonance signals detected by the RF coil 628, or a separate local coil, are received by the RF system 620. The responsive magnetic resonance signals may be amplified, demodulated, filtered, and digitized under direction of commands produced by the pulse sequence server 610. The RF system 620 includes an RF transmitter for producing a wide variety of RF pulses used in MRI pulse sequences. The RF transmitter is responsive to the prescribed scan and direction from the pulse sequence server 610 to produce RF pulses of the desired frequency, phase, and pulse amplitude waveform. The generated RF pulses may be applied to the whole-body RF coil 628 or to one or more local coils or coil arrays.

The RF system 620 also includes one or more RF receiver channels. An RF receiver channel includes an RF preamplifier that amplifies the magnetic resonance signal received by the coil 628 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M = \sqrt{I^2 + Q^2};$$

and the phase of the received magnetic resonance signal may also be determined according to the following relationship:

$$\varphi = \tan^{-1}\!\left(\frac{Q}{I}\right).$$

The pulse sequence server 610 may receive patient data from a physiological acquisition controller 630. By way of example, the physiological acquisition controller 630 may receive signals from a number of different sensors connected to the patient, including electrocardiograph ("ECG") signals from electrodes, or respiratory signals from a respiratory bellows or other respiratory monitoring devices. These signals may be used by the pulse sequence server 610 to synchronize, or "gate," the performance of the scan with the subject's heart beat or respiration.

The pulse sequence server 610 may also connect to a scan room interface circuit 632 that receives signals from various sensors associated with the condition of the patient and the magnet system. Through the scan room interface circuit 632, a patient positioning system 634 can receive commands to move the patient to desired positions during the scan.

The digitized magnetic resonance signal samples produced by the RF system 620 are received by the data acquisition server 612. The data acquisition server 612 operates in response to instructions downloaded from the operator workstation 602 to receive the real-time magnetic resonance data and provide buffer storage, so that data is not lost by data overrun. In some scans, the data acquisition server 612 passes the acquired magnetic resonance data to the data processor server 614. In scans that require information derived from acquired magnetic resonance data to control the further performance of the scan, the data acquisition server 612 may be programmed to produce such information and convey it to the pulse sequence server 610. For example, during pre-scans, magnetic resonance data may be acquired and used to calibrate the pulse sequence performed by the pulse sequence server 610. As another example, navigator signals may be acquired and used to adjust the operating parameters of the RF system 620 or the gradient system 618, or to control the view order in which k-space is sampled. In still another example, the data acquisition server 612 may also process magnetic resonance signals used to detect the arrival of a contrast agent in a magnetic resonance angiography ("MRA") scan. For example, the data acquisition server 612 may acquire magnetic resonance data and processes it in real-time to produce information that is used to control the scan.

The data processing server 614 receives magnetic resonance data from the data acquisition server 612 and processes the magnetic resonance data in accordance with instructions provided by the operator workstation 602. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 614 are conveyed back to the operator workstation 602 for storage. Real-time images may be stored in a data base memory cache, from which they may be output to operator display 602 or a display 636. Batch mode images or selected real time images may be stored in a host database on disc storage 638. When such images have been reconstructed and transferred to storage, the data processing server 614 may notify the data store server 616 on the operator workstation 602. The operator workstation 602 may be used by an operator to archive the images, produce films, or send the images via a network to other facilities.

The MRI system 600 may also include one or more networked workstations 642. For example, a networked workstation 642 may include a display 644, one or more input devices 646 (e.g., a keyboard, a mouse), and a processor 648. The networked workstation 642 may be located within the same facility as the operator workstation 602, or in a different facility, such as a different healthcare institution or clinic.

The networked workstation 642 may gain remote access to the data processing server 614 or data store server 616 via the communication system 640. Accordingly, multiple networked workstations 642 may have access to the data processing server 614 and the data store server 616. In this manner, magnetic resonance data, reconstructed images, or other data may be exchanged between the data processing server 614 or the data store server 616 and the networked workstations 642, such that the data or images may be remotely processed by a networked workstation 642.

Figure 7:
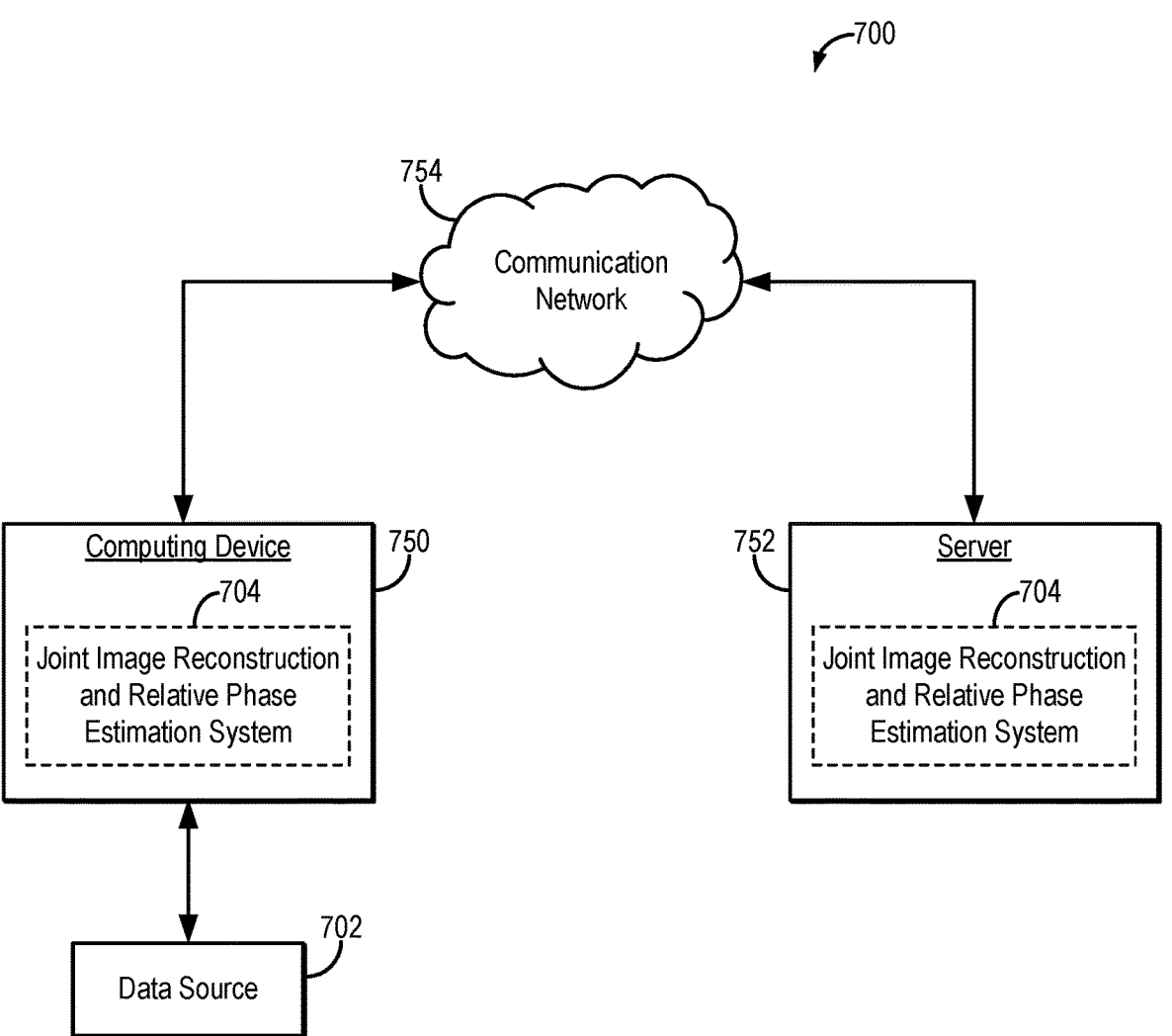
FIG. 7 is a block diagram of an example joint image reconstruction and relative phase estimation system in accordance with some embodiments described in the present disclosure.

Referring now to FIG. 7, an example of a system 700 for autocalibrated multi-shot magnetic resonance image reconstruction with joint optimization of shot-dependent phase and parallel image reconstruction in accordance with some embodiments of the systems and methods described in the present disclosure is shown. As shown in FIG. 7, a computing device 750 can receive one or more types of data (e.g., k-space data, k-t space data, coil sensitivity data) from data source 702, which may be a magnetic resonance imaging data source. In some embodiments, computing device 750 can execute at least a portion of a joint image reconstruction and relative phase estimation system 704 to reconstruct images from data received from the data source 702 using a joint optimization of shot-dependent phase and parallel image reconstruction.

Additionally or alternatively, in some embodiments, the computing device 750 can communicate information about data received from the data source 702 to a server 752 over a communication network 754, which can execute at least a portion of the joint image reconstruction and relative phase estimation system 704. In such embodiments, the server 752 can return information to the computing device 750 (and/or any other suitable computing device) indicative of an output of the joint image reconstruction and relative phase estimation system 704.

In some embodiments, computing device 750 and/or server 752 can be any suitable computing device or combination of devices, such as a desktop computer, a laptop computer, a smartphone, a tablet computer, a wearable computer, a server computer, a virtual machine being executed by a physical computing device, and so on. The computing device 750 and/or server 752 can also reconstruct images from the data. For example, the computing device 750 and/or server 752 can reconstruct images from k-space and/or k-t space data received from the data source 702.

In some embodiments, data source 702 can be any suitable source of data (e.g., k-space data, k-t space data, images reconstructed from k-space and/or k-t space data), such as an MRI system, another computing device (e.g., a server storing k-space and/or k-t space data), and so on. In some embodiments, data source 702 can be local to computing device 750. For example, data source 702 can be incorporated with computing device 750 (e.g., computing device 750 can be configured as part of a device for measuring, recording, estimating, acquiring, or otherwise collecting or storing data). As another example, data source 702 can be connected to computing device 750 by a cable, a direct wireless link, and so on. Additionally or alternatively, in some embodiments, data source 702 can be located locally and/or remotely from computing device 750, and can communicate data to computing device 750 (and/or server 752) via a communication network (e.g., communication network 754).

In some embodiments, communication network 754 can be any suitable communication network or combination of communication networks. For example, communication network 754 can include a Wi-Fi network (which can include one or more wireless routers, one or more switches, etc.), a peer-to-peer network (e.g., a Bluetooth network), a cellular network (e.g., a 3G network, a 4G network, etc., complying with any suitable standard, such as CDMA, GSM, LTE, LTE Advanced, WiMAX, etc.), other types of wireless network, a wired network, and so on. In some embodiments, communication network 754 can be a local area network, a wide area network, a public network (e.g., the Internet), a private or semi-private network (e.g., a corporate or university intranet), any other suitable type of network, or any suitable combination of networks. Communications links shown in FIG. 7 can each be any suitable communications link or combination of communications links, such as wired links, fiber optic links, Wi-Fi links, Bluetooth links, cellular links, and so on.

Figure 8:
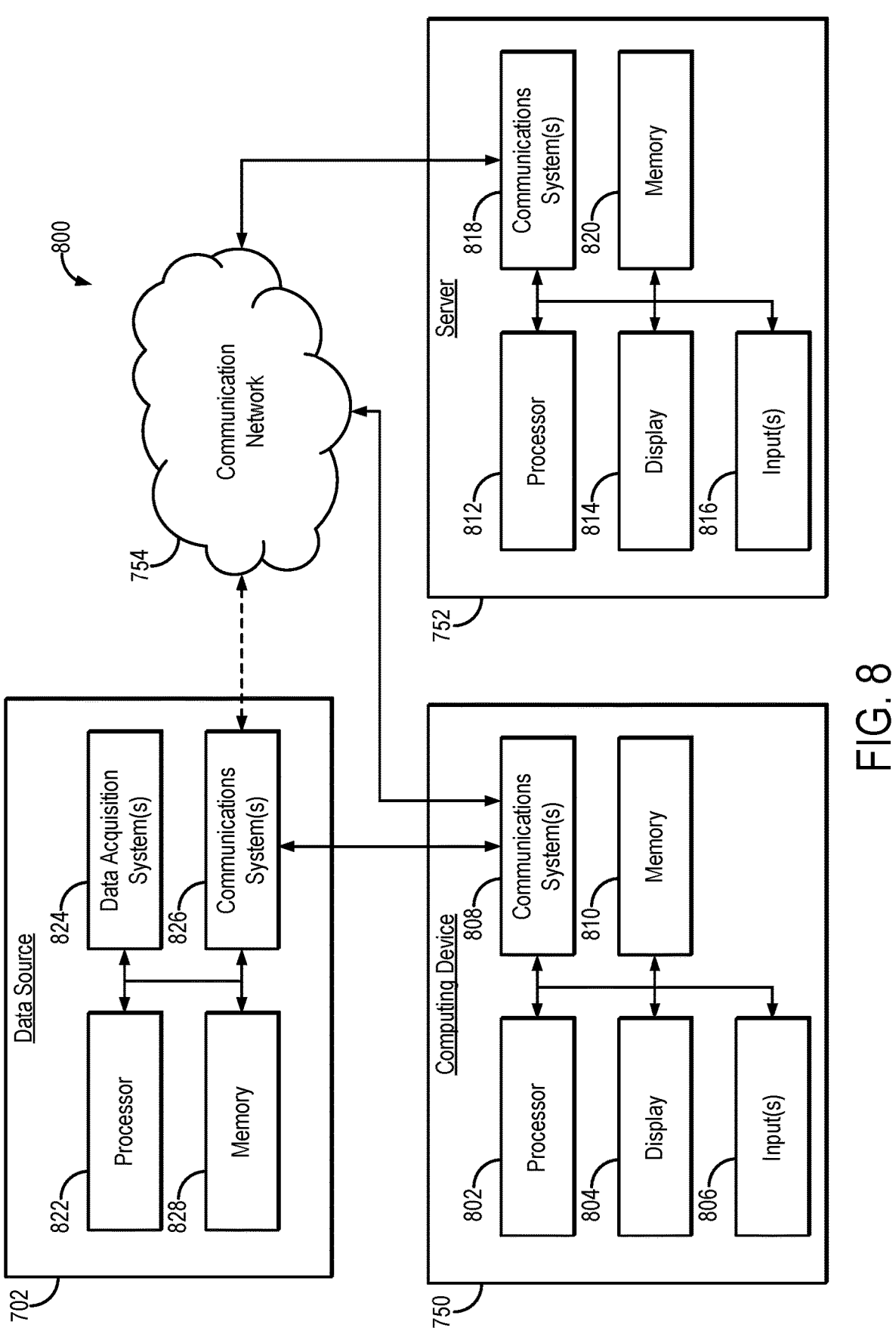
FIG. 8 is a block diagram of example components that can implement the system of FIG. 7.

Referring now to FIG. 8, an example of hardware 800 that can be used to implement data source 702, computing device 750, and server 752 in accordance with some embodiments of the systems and methods described in the present disclosure is shown.

As shown in FIG. 8, in some embodiments, computing device 750 can include a processor 802, a display 804, one or more inputs 806, one or more communication systems 808, and/or memory 810. In some embodiments, processor 802 can be any suitable hardware processor or combination of processors, such as a central processing unit ("CPU"), a graphics processing unit ("GPU"), and so on. In some embodiments, display 804 can include any suitable display devices, such as a liquid crystal display ("LCD") screen, a light-emitting diode ("LED") display, an organic LED ("OLED") display, an electrophoretic display (e.g., an "e-ink" display), a computer monitor, a touchscreen, a television, and so on. In some embodiments, inputs 806 can include any suitable input devices and/or sensors that can be used to receive user input, such as a keyboard, a mouse, a touchscreen, a microphone, and so on.

In some embodiments, communications systems 808 can include any suitable hardware, firmware, and/or software for communicating information over communication network 754 and/or any other suitable communication networks. For example, communications systems 808 can include one or more transceivers, one or more communication chips and/or chip sets, and so on. In a more particular example, communications systems 808 can include hardware, firmware, and/or software that can be used to establish a Wi-Fi connection, a Bluetooth connection, a cellular connection, an Ethernet connection, and so on.

In some embodiments, memory 810 can include any suitable storage device or devices that can be used to store instructions, values, data, or the like, that can be used, for example, by processor 802 to present content using display 804, to communicate with server 752 via communications system(s) 808, and so on. Memory 810 can include any suitable volatile memory, non-volatile memory, storage, or any suitable combination thereof. For example, memory 810 can include random-access memory ("RAM"), read-only memory ("ROM"), electrically programmable ROM ("EPROM"), electrically erasable ROM ("EEPROM"), other forms of volatile memory, other forms of non-volatile memory, one or more forms of semi-volatile memory, one or more flash drives, one or more hard disks, one or more solid state drives, one or more optical drives, and so on. In some embodiments, memory 810 can have encoded thereon, or otherwise stored therein, a computer program for controlling operation of computing device 750. In such embodiments, processor 802 can execute at least a portion of the computer program to present content (e.g., images, user interfaces, graphics, tables), receive content from server 752, transmit information to server 752, and so on. For example, the processor 802 and the memory 810 can be configured to perform the methods described herein (e.g., the method of FIG. 1).

In some embodiments, server 752 can include a processor 812, a display 814, one or more inputs 816, one or more communications systems 818, and/or memory 820. In some embodiments, processor 812 can be any suitable hardware processor or combination of processors, such as a CPU, a GPU, and so on. In some embodiments, display 814 can include any suitable display devices, such as an LCD screen, LED display, OLED display, electrophoretic display, a computer monitor, a touchscreen, a television, and so on. In some embodiments, inputs 816 can include any suitable input devices and/or sensors that can be used to receive user input, such as a keyboard, a mouse, a touchscreen, a microphone, and so on.

In some embodiments, communications systems 818 can include any suitable hardware, firmware, and/or software for communicating information over communication network 754 and/or any other suitable communication networks. For example, communications systems 818 can include one or more transceivers, one or more communication chips and/or chip sets, and so on. In a more particular example, communications systems 818 can include hardware, firmware, and/or software that can be used to establish a Wi-Fi connection, a Bluetooth connection, a cellular connection, an Ethernet connection, and so on.

In some embodiments, memory 820 can include any suitable storage device or devices that can be used to store instructions, values, data, or the like, that can be used, for example, by processor 812 to present content using display 814, to communicate with one or more computing devices 750, and so on. Memory 820 can include any suitable volatile memory, non-volatile memory, storage, or any suitable combination thereof. For example, memory 820 can include RAM, ROM, EPROM, EEPROM, other types of volatile memory, other types of non-volatile memory, one or more types of semi-volatile memory, one or more flash drives, one or more hard disks, one or more solid state drives, one or more optical drives, and so on. In some embodiments, memory 820 can have encoded thereon a server program for controlling operation of server 752. In such embodiments, processor 812 can execute at least a portion of the server program to transmit information and/or content (e.g., data, images, a user interface) to one or more computing devices 750, receive information and/or content from one or more computing devices 750, receive instructions from one or more devices (e.g., a personal computer, a laptop computer, a tablet computer, a smartphone), and so on.

In some embodiments, the server 752 is configured to perform the methods described in the present disclosure. For example, the processor 812 and memory 820 can be configured to perform the methods described herein (e.g., the method of FIG. 1).

In some embodiments, data source 702 can include a processor 822, one or more data acquisition systems 824, one or more communications systems 826, and/or memory 828. In some embodiments, processor 822 can be any suitable hardware processor or combination of processors, such as a CPU, a GPU, and so on. In some embodiments, the one or more data acquisition systems 824 are generally configured to acquire data, images, or both, and can include an MRI system. Additionally or alternatively, in some embodiments, the one or more data acquisition systems 824 can include any suitable hardware, firmware, and/or software for coupling to and/or controlling operations of an MRI system. In some embodiments, one or more portions of the data acquisition system(s) 824 can be removable and/or replaceable.

Note that, although not shown, data source 702 can include any suitable inputs and/or outputs. For example, data source 702 can include input devices and/or sensors that can be used to receive user input, such as a keyboard, a mouse, a touchscreen, a microphone, a trackpad, a trackball, and so on. As another example, data source 702 can include any suitable display devices, such as an LCD screen, an LED display, an OLED display, an electrophoretic display, a computer monitor, a touchscreen, a television, etc., one or more speakers, and so on.

In some embodiments, communications systems 826 can include any suitable hardware, firmware, and/or software for communicating information to computing device 750 (and, in some embodiments, over communication network 754 and/or any other suitable communication networks). For example, communications systems 826 can include one or more transceivers, one or more communication chips and/or chip sets, and so on. In a more particular example, communications systems 826 can include hardware, firmware, and/or software that can be used to establish a wired connection using any suitable port and/or communication standard (e.g., VGA, DVI video, USB, RS-232, etc.), Wi-Fi connection, a Bluetooth connection, a cellular connection, an Ethernet connection, and so on.

In some embodiments, memory 828 can include any suitable storage device or devices that can be used to store instructions, values, data, or the like, that can be used, for example, by processor 822 to control the one or more data acquisition systems 824, and/or receive data from the one or more data acquisition systems 824; to generate images from data; present content (e.g., images, a user interface) using a display; communicate with one or more computing devices 750; and so on. Memory 828 can include any suitable volatile memory, non-volatile memory, storage, or any suitable combination thereof. For example, memory 828 can include RAM, ROM, EPROM, EEPROM, other types of volatile memory, other types of non-volatile memory, one or more types of semi-volatile memory, one or more flash drives, one or more hard disks, one or more solid state drives, one or more optical drives, and so on. In some embodiments, memory 828 can have encoded thereon, or otherwise stored therein, a program for controlling operation of data source 802. In such embodiments, processor 822 can execute at least a portion of the program to generate images, transmit information and/or content (e.g., data, images) to one or more computing devices 750, receive information and/or content from one or more computing devices 750, receive instructions from one or more devices (e.g., a personal computer, a laptop computer, a tablet computer, a smartphone, etc.), and so on.

In some embodiments, any suitable computer-readable media can be used for storing instructions for performing the functions and/or processes described herein. For example, in some embodiments, computer-readable media can be transitory or non-transitory. For example, non-transitory computer-readable media can include media such as magnetic media (e.g., hard disks, floppy disks), optical media (e.g., compact discs, digital video discs, Blu-ray discs), semiconductor media (e.g., RAM, flash memory, EPROM, EEPROM), any suitable media that is not fleeting or devoid of any semblance of permanence during transmission, and/or any suitable tangible media. As another example, transitory computer-readable media can include signals on networks, in wires, conductors, optical fibers, circuits, or any suitable media that is fleeting and devoid of any semblance of permanence during transmission, and/or any suitable intangible media.

The present disclosure has described one or more preferred embodiments, and it should be appreciated that many equivalents, alternatives, variations, and modifications, aside from those expressly stated, are possible and within the scope of the invention.

The invention claimed is:

1. A method for reconstructing an image from data acquired with a magnetic resonance imaging (MRI) system, the method comprising:
   (a) accessing multi-shot k-space data with a computer system, wherein the multi-shot k-space data have been acquired with an MRI system using a pulse sequence comprising multiple shots;
   (b) accessing shot-dependent phase data with the computer system, wherein the shot-dependent phase data comprise estimates of relative phase differences between the multiple shots;
   (c) reconstructing, with the computer system, an image of the subject from the multi-shot k-space data using an image reconstruction algorithm that incorporates and iteratively updates the shot-dependent phase data based in part on a self-consistency of the reconstructed image with the multi-shot k-space data.

2. The method of claim 1, wherein accessing the shot-dependent phase data include estimating initial shot-dependent phase data with the computer system by reconstructing initial images from the multi-shot k-space data and estimating the initial shot-dependent phase data from the initial images.

3. The method of claim 1, wherein the shot-dependent phase data are updated in each iteration of the image reconstruction algorithm using an ESPIRIT algorithm to estimate an updated relative phase differences between shots of the multi-shot k-space data.

4. The method of claim 1, wherein the image reconstruction algorithm comprises, in each iteration:
   reconstructing coil image data comprising a coil image for each coil in a multicoil receive array for each of the multiple shots in the multi-shot k-space data;
   forming a coil combined image for each shot by combining coil images in the coil image data for each shot;
   evaluating a data consistency condition between the combined coil image for each shot and the multi-shot k-space data.

5. The method of claim 1, wherein the multi-shot k-space data are undersampled multi-shot k-space data.

6. The method of claim 5, wherein the undersampled multi-shot k-space data are undersampled in at least one in-plane k-space dimension.

7. The method of claim 1, wherein a machine learning (ML) prior is incorporated into the image reconstruction algorithm.

8. The method of claim 1, wherein accessing the multi-shot k-space data with the computer system includes acquiring the multi-shot k-space data with the MRI system and accessing the acquired multi-shot k-space data.

9. The method of claim 1, wherein the multi-shot k-space are acquired using a multi-shot echo planar imaging (EPI) pulse sequence.

10. The method of claim 4, wherein the image reconstruction algorithm is stopped when evaluating the data consistency condition satisfied a stopping criterion.

11. The method of claim 6, wherein the undersampled multi-shot k-space data are undersampled in a phase-encoding dimension.

12. The method of claim 7, wherein the ML prior comprises a network that has been trained on training data to minimize artifacts attributable to model errors.

* * * * *

14